US012733117B2

(12) United States Patent
Choi et al.

(10) Patent No.: US 12,733,117 B2
(45) Date of Patent: Sep. 8, 2026

(54) GRADATION COVER GLASS USING COLOR GLASS AND ELECTRONIC DEVICE INCLUDING THE SAME

(71) Applicant: SAMSUNG ELECTRONICS CO., LTD., Suwon-si (KR)

(72) Inventors: Jongmun Choi, Suwon-si (KR); Hakju Kim, Suwon-si (KR); Yeongbeom Kim, Suwon-si (KR); Juree Kim, Suwon-si (KR); Jongcheol Jang, Suwon-si (KR); Hyunsuk Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 561 days.

(21) Appl. No.: 17/812,121

(22) Filed: Jul. 12, 2022

(65) Prior Publication Data

US 2023/0011603 A1 Jan. 12, 2023

Related U.S. Application Data

(63) Continuation of application No. PCT/KR2022/008131, filed on Jun. 9, 2022.

(30) Foreign Application Priority Data

Jul. 12, 2021 (KR) ........................ 10-2021-0091262

(51) Int. Cl.
*H05K 5/03* (2006.01)

(52) U.S. Cl.
CPC ...................................... *H05K 5/03* (2013.01)

(58) Field of Classification Search
CPC ...... H05K 5/0086; B32B 17/06; B32B 17/10; B32B 17/10018; B32B 17/10155; B32B 17/10339; H04M 1/0283
See application file for complete search history.

(56) References Cited

U.S. PATENT DOCUMENTS

2009/0068404 A1* 3/2009 Akieda .................. B32B 27/06 156/60
2012/0275097 A1 11/2012 Lee
(Continued)

FOREIGN PATENT DOCUMENTS

JP H11043355 A 2/1999
JP WO15-072538 S 3/2017
(Continued)

OTHER PUBLICATIONS

Supplementary European Search Report dated Aug. 6, 2024, in connection with European Patent Application No. 22842283.8, 9 pages.

(Continued)

*Primary Examiner* — Alicia J Weydemeyer

(57) ABSTRACT

According to various embodiments of the disclosure, an electronic device may comprise a cover glass covering at least a first surface. The cover glass may include a color glass including an end having a first thickness and an end having a second thickness different from the first thickness and configured to sequentially vary in thickness from the first thickness to the second thickness, an attaching layer disposed under the color glass and including a shape corresponding to the sequentially varying shape of the color glass, and a printed layer disposed under the attaching layer.

12 Claims, 11 Drawing Sheets

(56) References Cited

U.S. PATENT DOCUMENTS

| | | | | |
|---|---|---|---|---|
| 2016/0288465 | A1 | 10/2016 | Nakayama et al. | |
| 2020/0045155 | A1* | 2/2020 | Ha | G02B 5/003 |
| 2020/0198294 | A1 | 6/2020 | Lee et al. | |
| 2021/0170785 | A1 | 6/2021 | Kim et al. | |
| 2021/0333451 | A1 | 10/2021 | Song et al. | |

FOREIGN PATENT DOCUMENTS

| | | | |
|---|---|---|---|
| JP | 2019043795 | A | 3/2019 |
| KR | 10-0740011 | B1 | 7/2007 |
| KR | 20100119027 | A | 11/2010 |
| KR | 20110009874 | A | 1/2011 |
| KR | 10-2011-0101438 | A | 9/2011 |
| KR | 20140100775 | A | 8/2014 |
| KR | 10-1671192 | B1 | 11/2016 |
| KR | 20170113929 | A | 10/2017 |
| KR | 20170114570 | A | 10/2017 |
| KR | 20180109360 | A | 10/2018 |
| KR | 20190047971 | A | 5/2019 |
| KR | 20190118496 | A | 10/2019 |
| KR | 20200015046 | A | 2/2020 |
| KR | 20200031774 | A | 3/2020 |
| KR | 20200076579 | A | 6/2020 |
| KR | 20200086931 | A | 7/2020 |
| WO | 2020098438 | A1 | 5/2020 |

OTHER PUBLICATIONS

International Search Report and Written Opinion of the International Searching Authority dated Sep. 13, 2022, in connection with International Application No. PCT/KR2022/008131, 10 pages.

Substantive Examination Report issued Jan. 14, 2025, in connection with Saudi Arabian Patent Application No. 523451258, 11 pages.

Office Action issued Apr. 30, 2025, in connection with Korean Patent Application No. 10-2021-0091262, 13 pages.

Office Action issued Jan. 20, 2026, in connection with Korean Patent Application No. 10-2021-0091262, 17 pages.

Office Action dated Oct. 20, 2025, in connection with European Patent Application No. 22 842 283.8, 5 pages.

* cited by examiner

460
A-A'
440
410
420
400
w1
W
w2
430
Z
X
Y

P1
400
w2
w1
410
460
420
w4
430
440
Z
X
Y

GRADATION COVER GLASS USING COLOR GLASS AND ELECTRONIC DEVICE INCLUDING THE SAME

CROSS-REFERENCE TO RELATED APPLICATIONS

This application is a bypass continuation of International Application No. PCT/KR2022/008131 filed Jun. 9, 2022, in the Korean Intellectual Property Receiving Office and claiming priority to Korean Patent Application No. 10-2021-0091262, filed on Jul. 12, 2021, in the Korean Intellectual Property Receiving Office, the disclosures of which are incorporated by reference herein in their entireties.

BACKGROUND

1. Field

Various embodiments of the disclosure relate to a gradation cover glass using color glass and an electronic device including the same.

2. Description of Related Art

Recently, design demands are increasing along with demand for slimming down portable terminals, such as mobile phones, smart phones, personal digital assistants (PDAs), portable multimedia players (PMPs), and laptop computers from consumers. Accordingly, various attempts have been made to add a design to the cover glass positioned on the outer surface of the electronic device along with the slimming of the display panel.

Currently, the gradation of the rear glass cover is mainly manufactured by a digital direct printing (DDP) thermal transfer method. The DDP thermal transfer method is a technique in which a printer head, which is a heat source, is heated and thermocompressed to a heat transfer sheet to be transferred to a printed matter. The diameter of the printer head is about 100 um or less and is composed of a number of fine bundles, which are precisely controlled with digital signals to thermocompress the thermal transfer sheet by pointillism, thereby depicting gradations.

The DDP thermal transfer gradation method has actually been employed in many products but is limited to the size of processable fabric that may be processed due to the principle of equipment operation. Thus, this technique suffers from shortage of supply per deployment and high costs (about 3 times or more as compared to that of a unit decoration film). Further, it requires that a DDP gradation film and a color decoration film (e.g., including UV molding, deposition, or printing) be separately produced and joined to implement a final unit product, resultantly thickening the film by about 75 um to about 100 um. Further, in terms of design and quality, it may merely express a monotonous aesthetic feeling in a two-dimensional plane structure.

SUMMARY

In general, the plate covering the front surface and/or rear surface of the electronic device may be manufactured by joining a glass with a patterned and/or colored film. This manufacturing method may deteriorate visibility because the scheme in which the pattern is exposed to the outside is predetermined. Further, the manufacturing method is merely able to represent one color and be short of the depth of color that the user feels by looking at the plate.

According to various embodiments of the disclosure, it is possible to implement gradation effects that give a different sensation of color depending on the thickness of the color glass and have a natural and stereoscopic feeling of color even without a separate decoration film.

According to various embodiments of the disclosure, it is possible to implement a slimmer electronic device by thinning the cover glass as compared with the prior art.

According to various embodiments of the disclosure, an electronic device may comprise a cover glass covering at least a first surface. The cover glass may include a color glass including an end having a first thickness and an end having a second thickness different from the first thickness and configured to sequentially vary in thickness from the first thickness to the second thickness, an attaching layer disposed under the color glass and including a shape corresponding to the sequentially varying shape of the color glass, and a printed layer disposed under the attaching layer.

According to various embodiments of the disclosure, an electronic device may comprise a cover glass covering at least a first surface. The cover glass may include a color glass. The color glass may include a first portion including an end having a first thickness and an end having a second thickness different from the first thickness and a second portion having a constant third thickness. The first portion may be configured to sequentially vary from the first thickness to the second thickness.

According to various embodiments of the disclosure, the cover glass may implement gradation effects that give a different sensation of color depending on the thickness of the color glass and have a natural and stereoscopic feeling of color even without a separate decoration film.

According to various embodiments of the disclosure, in the cover glass, a cover glass formed in a first color and an attaching layer formed in a second color may be stacked one over the other, thereby implementing a gradation effect of the first color and the second color.

According to various embodiments of the disclosure, the printed layer may give a further enhanced feeling of color to the gradation effect obtained by the color glass and the attaching layer.

According to various embodiments of the disclosure, it is possible to implement a slimmer electronic device by thinning the cover glass as compared with conventional covers for electronic devices.

Effects of the disclosure are not limited to the foregoing, and other unmentioned effects would be apparent to one of ordinary skill in the art from the following description.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
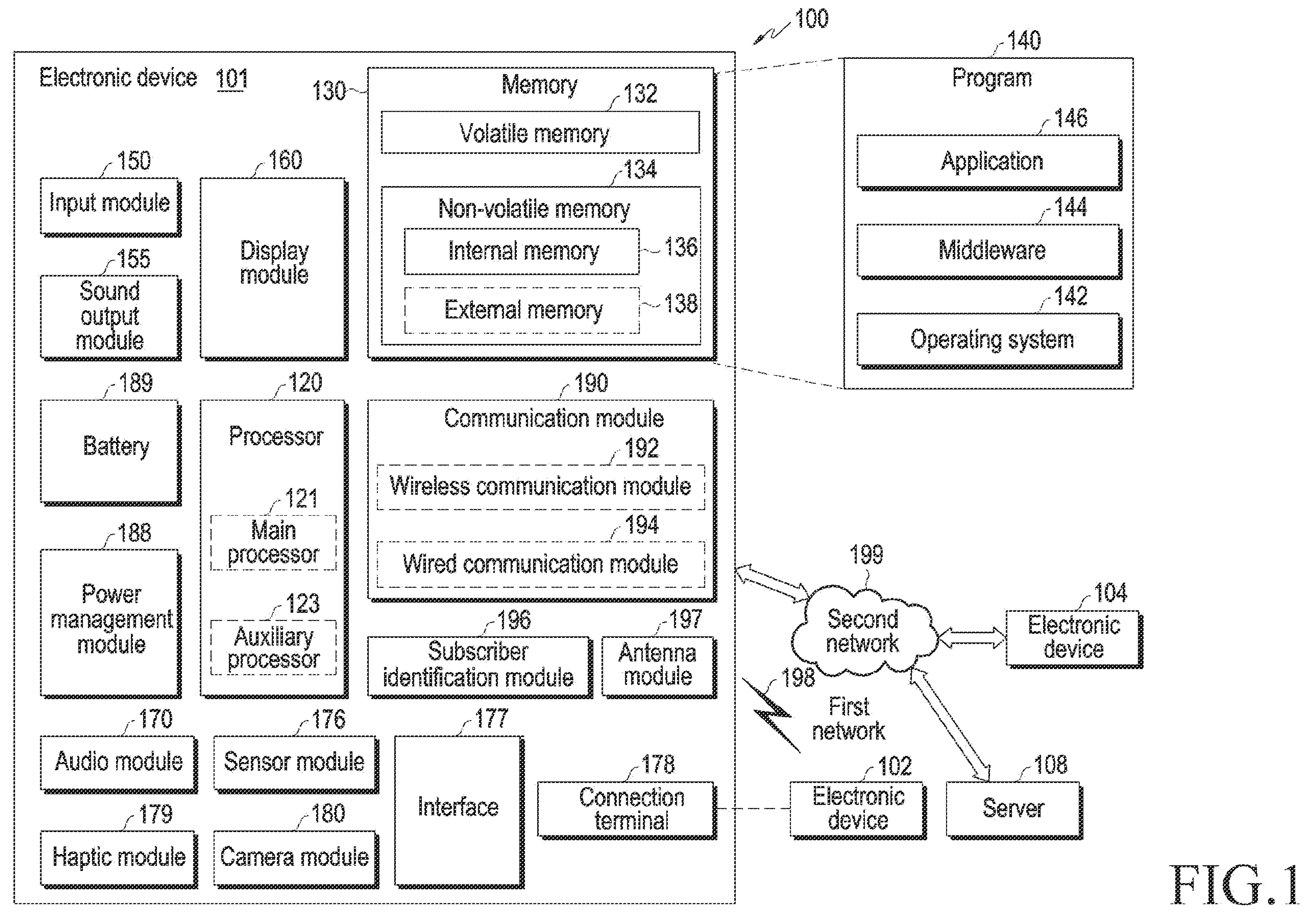
FIG. 1 is a block diagram illustrating an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna.

The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as “A or B,” “at least one of A and B,” “at least one of A or B,” “A, B, or C,” “at least one of A, B, and C,” and “at least one of A, B, or C,” may include all possible combinations of the items enumerated together in a corresponding one of the phrases. As used herein, such terms as “1st” and “2nd,” or “first” and “second” may be used to simply distinguish a corresponding component from another, and does not limit the components in other aspect (e.g., importance or order). It is to be understood that if an element (e.g., a first element) is referred to, with or without the term “operatively” or “communicatively”, as “coupled with,” “coupled to,” “connected with,” or “connected to” another element (e.g., a second element), it means that the element may be coupled with the other element directly (e.g., wiredly), wirelessly, or via a third element.

As used herein, the term “module” may include a unit implemented in hardware, software, or firmware, and may interchangeably be used with other terms, for example, “logic,” “logic block,” “part,” or “circuitry”. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
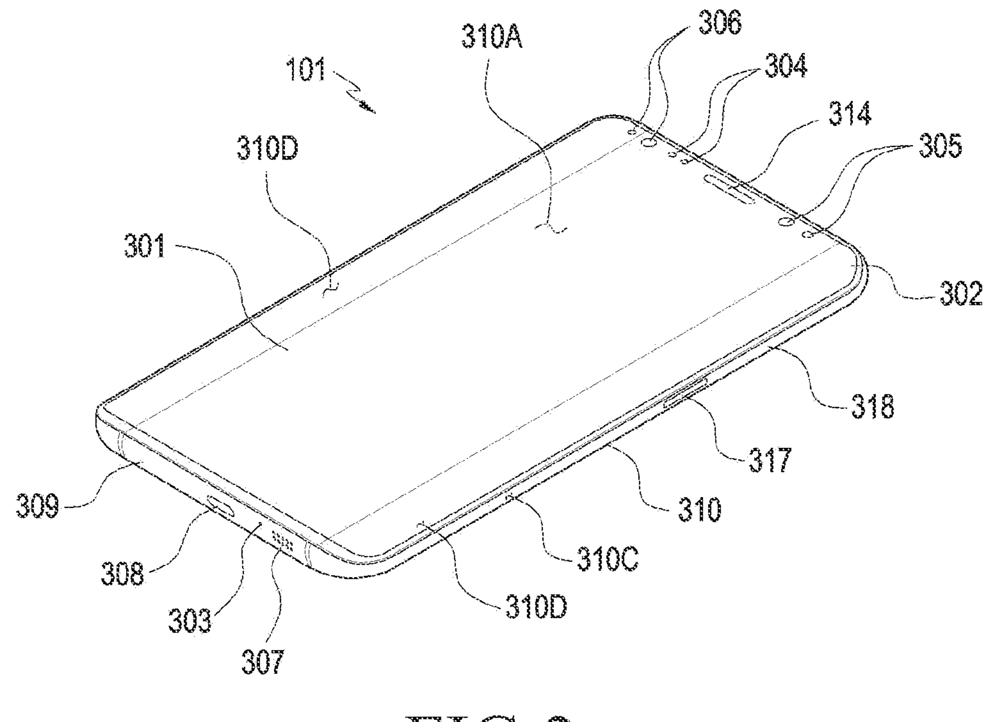
FIG. 2 is a front perspective view illustrating an electronic device according to various embodiments of the disclosure.
Figure 3:
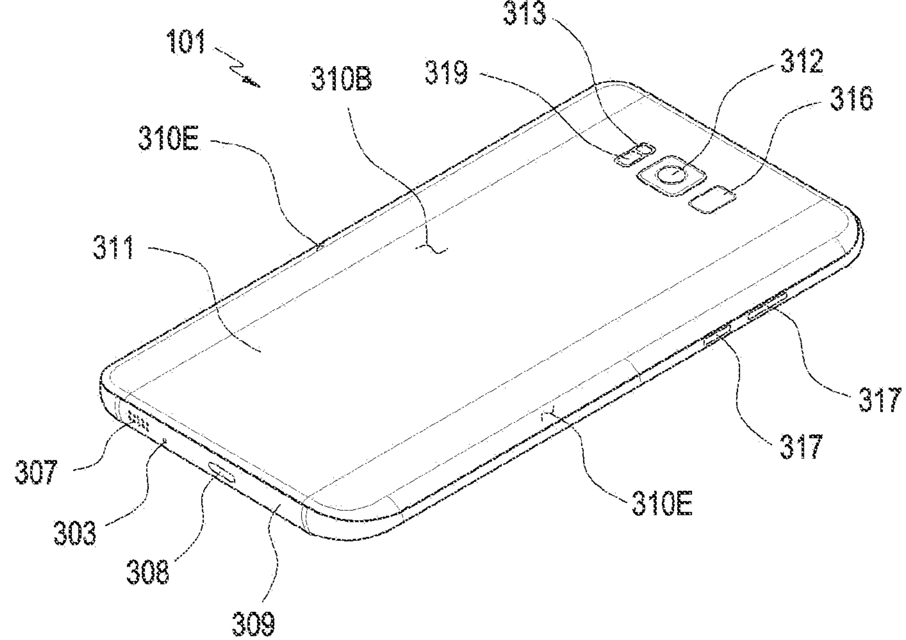
FIG. 3 is a rear perspective view illustrating an electronic device according to various embodiments of the disclosure.

FIG. 2 is a front perspective view illustrating an electronic device 101 according to various embodiments of the disclosure. FIG. 3 is a rear perspective view illustrating an electronic device 101 according to various embodiments of the disclosure.

Referring to FIGS. 2 and 3, according to certain embodiments, an electronic device 101 may include a housing 310 with a first (or front) surface 310A, a second (or rear) surface 310B, and a side surface 310C surrounding a space between the first surface 310A and the second surface 310B. According to certain embodiments, the housing may denote a structure forming part of the first surface 310A, the second surface 310B, and the side surface 310C of FIG. 2. According to certain embodiments, at least part of the first surface 310A may have a substantially transparent front plate 302 (e.g., a glass plate or polymer plate). The second surface 310B may be formed by a rear plate 311 that is substantially opaque. The rear plate 311 may be formed of, e.g., laminated or colored glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to certain embodiments, the rear plate 311 and the side bezel structure 318 may be integrally formed together and include the same material (e.g., a metal, such as aluminum).

In the embodiment illustrated, the front plate 302 may include two first areas 310D, which seamlessly and bendingly extend from the first surface 310A to the rear plate 311, on both the long edges of the front plate 302. In the embodiment (refer to FIG. 3) illustrated, the rear plate 311 may include two second areas 310E, which seamlessly and bendingly extend from the second surface 310B to the front plate, on both the long edges. According to certain embodiments, the front plate 302 (or the rear plate 311) may include only one of the first areas 310D (or the second areas 310E). Alternatively, the first areas 310D or the second areas 310E may partially be excluded. According to certain embodiments, at a side view of the electronic device 101, the side bezel structure 318 may have a first thickness (or width) for sides that do not include the first areas 310D or the second areas 310E and a second thickness, which is smaller than the first thickness, for sides that include the first areas 310D or the second areas 310E.

According to certain embodiments, the electronic device 101 may include at least one or more of a display 301, audio modules 303, 307, and 314, sensor modules 304, 316, and 319, camera modules 305, 312, and 313, key input devices 317, a light emitting device 306, and connector holes 308 and 309. According to certain embodiments, the electronic device 101 may exclude at least one (e.g., the key input device 317 or the light emitting device 306) of the components or may add other components.

According to certain embodiments, the display 301 may be visually exposed through, e.g., a majority portion of the front plate 302. According to certain embodiments, at least a portion of the display 301 may be exposed through the front plate 302 forming the first surface 310A and the first areas 310D of the side surface 310C. According to certain embodiments, the edge of the display 301 may be formed to be substantially the same in shape as an adjacent outer edge of the front plate 302. According to certain embodiments, the interval between the outer edge of the display 301 and the outer edge of the front plate 302 may remain substantially even to give a larger area of exposure the display 301.

According to certain embodiments (not shown), the screen display area of the display 301 may have a recess or an opening in a portion thereof, and at least one or more of the audio module 314, sensor module 304, camera module 305, and light emitting device 306 may be aligned with the recess or opening. According to certain embodiments, at least one or more of the audio module 314, a sensor module 304, a camera module 305, a fingerprint sensor 316, and a light emitting device 306 may be included on the rear surface of the screen display area of the display 301. According to certain embodiments, the display 301 may be disposed to be coupled with, or adjacent, a touch detecting circuit, a pressure sensor capable of measuring the strength (pressure) of touches, and/or a digitizer for detecting a magnetic field-type stylus pen. According to certain embodiments, at least part of the sensor modules 304 and 319 and/or at least part of the key input device 317 may be disposed in the first areas 310D and/or the second areas 310E.

According to certain embodiments, the audio modules 303, 307, and 314 may include, e.g., a microphone hole 303 and speaker holes 307 and 314. The microphone hole 303 may have a microphone inside to obtain external sounds. According to certain embodiments, there may be a plurality of microphones to be able to detect the direction of a sound. The speaker holes 307 and 314 may include an external speaker hole 307 and a phone receiver hole 314. In some embodiments, the speaker holes 307 and 314 and the microphone hole 303 may be implemented as a single hole, or a speaker may be included without the speaker holes 307 and 314 (e.g., a piezo speaker). The audio modules 303, 307, and 314 are not limited to the above-described structure. Depending on the structure of the electronic device 101, various design changes may be made, e.g., only some of the audio modules may be mounted, or a new audio module may be added.

According to certain embodiments, the sensor modules 304, 316, and 319 may generate an electrical signal or a data value corresponding to an internal operating state or an external environmental state of the electronic device 101. The sensor modules 304, 316, and 319 may include a first sensor module 304 (e.g., a proximity sensor) disposed on the first surface 310A of the housing 310, and/or a second sensor module (e.g., a fingerprint sensor), and/or a third sensor module 319 (e.g., a heart-rate monitor (HRM) sensor) disposed on the second surface 310B of the housing 310, and/or a fourth sensor module 316 (e.g., a fingerprint sensor). The fingerprint sensor may be disposed on the second surface 310B as well as on the first surface 310A (e.g., the display 301) of the housing 310. The electronic device 101 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor. The sensor modules 304, 316, and 319 are not limited to the above-described structure. Depending on the structure of the electronic device 101, various design changes may be made, e.g., only some of the sensor modules may be mounted, or a new sensor module may be added.

According to certain embodiments, the camera modules 305, 312, and 313 may include a first camera device 305 disposed on the first surface 310A of the electronic device 101, and a second camera device 312 and/or a flash 313 disposed on the second surface 310B. The camera modules 305 and 312 may include one or more lenses, an image sensor, and/or an image signal processor. The flash 313 may include, e.g., a light emitting diode (LED) or a xenon lamp. According to certain embodiments, two or more lenses (an infrared (IR) camera, a wide-angle lens, and a telescopic lens) and image sensors may be disposed on one surface of the electronic device 101. The camera modules 305, 312, and 313 are not limited to the above-described structure. Depending on the structure of the electronic device 101, various design changes may be made—e.g., only some of the camera modules may be mounted, or a new camera module may be added.

According to certain embodiments, the key input device 317 may be disposed, e.g., on the side surface 310C of the housing 310. According to certain embodiments, the electronic device 101 may exclude all or some of the above-mentioned key input devices 317 and the excluded key input devices 317 may be implemented in other forms, e.g., as soft keys, on the display 301. According to certain embodiments, the key input device may include the sensor module 316 disposed on the second surface 310B of the housing 310.

According to certain embodiments, the light emitting device 306 may be disposed on the first surface 310A of the housing 310, for example. The light emitting device 306 may provide, e.g., information about the state of the electronic device 101 in the form of light. According to certain embodiments, the light emitting device 306 may provide a light source that interacts with, e.g., the camera module 305. The light emitting device 306 may include, e.g., a light emitting diode (LED), an infrared (IR) LED, or a xenon lamp.

According to certain embodiments, the connector holes 308 and 309 may include, e.g., a first connector hole 308 for receiving a connector (e.g., a universal serial bus (USB) connector) for transmitting or receiving power and/or data to/from an external electronic device and/or a second connector hole (e.g., an earphone jack) 309 for receiving a connector for transmitting or receiving audio signals to/from the external electronic device. The connector holes 308 and 309 are not limited to the above-described structure. Depending on the structure of the electronic device 101, various design changes may be made, e.g., only some of the connector holes may be mounted, or a new connector hole may be added.

Although FIGS. 2 and 3 exemplify a bar-type electronic device 101 as an example of the shape of the electronic device according to various embodiments of the disclosure, the shape of the electronic device is not limited thereto. For example, the electronic device may be configured as an expandable or transformable electronic device, such as a slidable type, a rollable type, and a foldable type.

Figure 4:
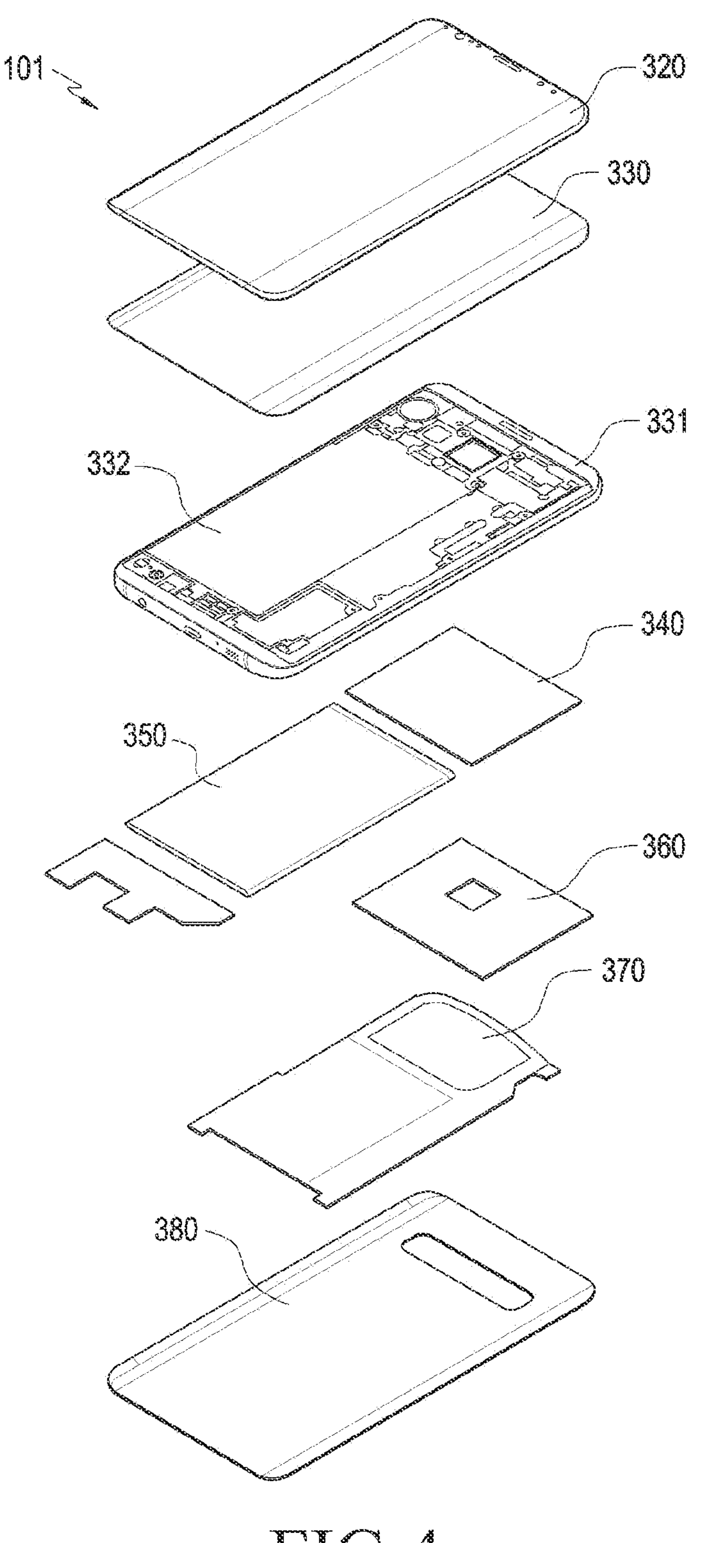
FIG. 4 is an exploded perspective view illustrating an electronic device according to various embodiments of the disclosure.

FIG. 4 is an exploded perspective view illustrating an electronic device 101 according to various embodiments.

Referring to FIG. 4, according to various embodiments, an electronic device 101 (e.g., the electronic device 101 of FIGS. 1 to 3) may include a side bezel structure 331, a first supporting member 332 (e.g., a bracket), a front plate 320, a display 330, a printed circuit board (PCB) 340, a battery 350, a second supporting member 360 (e.g., a rear case), an antenna 370, and a rear plate 380. According to certain embodiments, the electronic device 101 may exclude at least one (e.g., the first supporting member 332 or second supporting member 360) of the components or may add other components. At least one of the components of the electronic device 101 may be the same or similar to at least one of the components of the electronic device 101 of FIG. 2 or 3 and no duplicate description is made below.

According to various embodiments, the first supporting member 332 may be disposed inside the electronic device 101 to be connected with the side bezel structure 331 or integrated with the side bezel structure 331. The first supporting member 332 may be formed of, e.g., a metal and/or non-metallic material (e.g., polymer). The display 330 may be joined onto one surface of the first supporting member 332, and the printed circuit board 340 may be joined onto the opposite surface of the first supporting member 332. A processor, memory, and/or interface may be mounted on the printed circuit board 340. The processor may include one or more of, e.g., a central processing unit, an application processor, a graphic processing device, an image signal processing, a sensor hub processor, or a communication processor.

According to certain embodiments, the memory may include, e.g., a volatile or non-volatile memory.

According to certain embodiments, the interface may include, for example, a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to certain embodiments, the battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

According to certain embodiments, the antenna 370 may be disposed between the rear plate 380 and the battery 350. The antenna 370 may include, e.g., a near-field communication (NFC) antenna, a wireless charging antenna, and/or a magnetic secure transmission (MST) antenna. The antenna 370 may perform short-range communication with, e.g., an external device or may wirelessly transmit or receive power necessary for charging. According to certain embodiments, an antenna structure may be formed by a portion or combination of the side bezel structure 331 and/or the first supporting member 332.

Figures 5A, 5B:
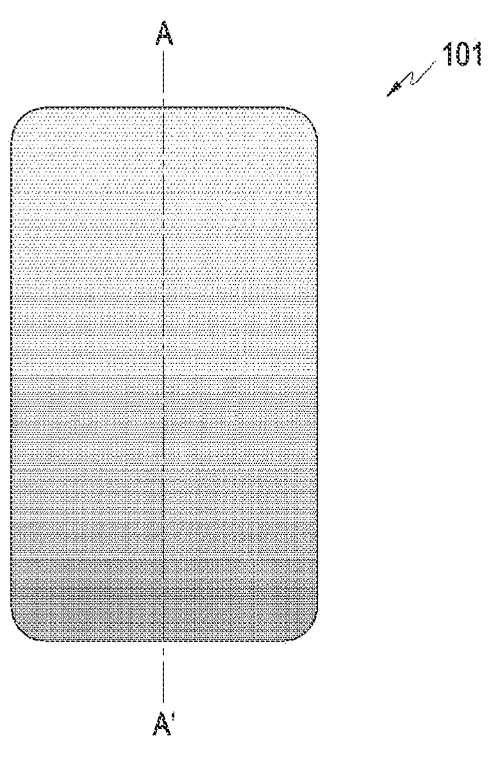
FIG. 5A is a rear view illustrating an electronic device according to various embodiments of the disclosure.
FIG. 5B is a cross-sectional view illustrating a cover glass taken along line A-A' of an electronic device according to various embodiments of the disclosure.
Figure 6:
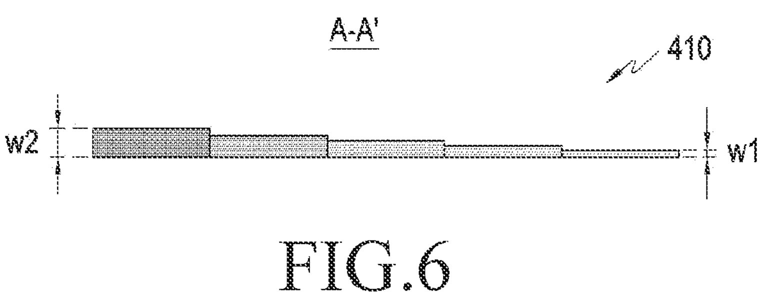
FIG. 6 is a side view illustrating a color glass of a cover glass according to various embodiments of the disclosure.

FIG. 5A is a rear view illustrating an electronic device 101 according to various embodiments of the disclosure. FIG. 5B is a cross-sectional view illustrating a cover glass 400 taken along line A-A' of an electronic device 101 according to various embodiments of the disclosure. FIG. 6 is a side view illustrating a color glass 410 of a cover glass 400 according to various embodiments of the disclosure.

According to various embodiments, an electronic device (e.g., the electronic device 101 of FIGS. 1 to 4) may include a cover glass 400.

Referring to FIG. 5B, the cover glass 400 may include a color glass 410, an attaching layer 420 disposed under the color glass 410 and formed to correspond to the color glass 410, a printed layer 430 disposed under the attaching layer 420, and an adhesive layer 440. The configuration of the color glass 400 of FIG. 5B may be identical in whole or part to the configuration of the rear plate 311 of FIGS. 2 and 3.

In FIG. 5, 7' may mean a thickness direction of the color glass 400. Further, in certain embodiments of the present disclosure, '+Z' may mean an outward direction of the electronic device, and '−Z' may mean an inward direction of the electronic device.

According to various embodiments, the color glass 410 of the cover glass 400 may mean colored tempered glass. The color glass 410 may be implemented by dissolving metal ions, such as of Fe, Cr, Mn, Co, and Ni, in glass to absorb light of a designated wavelength. The color glass 410 may have a unique color and may have a characteristic that the sense of depth and sense of color change according to the shape or thickness.

According to various embodiments, the color glass 410 may come in a variety of colors to meet customers' needs and may be formed in a first color forming a gradation.

The color glass 410 may include a surface parallel to the XY plane. The thickness from one surface to the other may not be uniform. According to various embodiments, referring to FIG. 5B, the color glass 410 may include a plurality of thicknesses, and the cover glass 410 may have, e.g., a first thickness w1 and a second thickness w2 different from the first thickness w1. In this case, the color glass 410 may be configured to change sequentially from the first thickness w1 to the second thickness w2. For example, when the thickness of the left end of the color glass 410 is 'w1' and the thickness of the right end of the color glass 410 is 'w2' (w1<w2), the thickness of the color glass 410 may sequentially vary from 'w1' to 'w2.' The two or more thicknesses may be connected in a stepwise manner or obliquely, as shown in FIG. 6. Accordingly, it is possible to implement gradation effects that give a different sensation of color depending on the thickness of the color glass 410 and have a natural and stereoscopic feeling of color even without a separate decoration film.

According to various embodiments, the color glass 410 and the attaching layer 420 may be coupled through the adhesive layer 440. As the adhesive layer 440, various types of adhesives including components, such as epoxy, acrylic, and/or ester, may be used. For example, a transparent adhesive, such as an optically transparent and uniform optically clear adhesive (OCA) or an optically clear region (OCR), may be used to prevent defects, such as fine spots or wrinkles. The adhesive layer 440 may be hardened through a process, such as UV curing or thermal curing. However, the type or bonding method for the adhesive layer 440 is not limited to the above embodiment, and various design changes may be made thereto.

According to various embodiments, the combined thickness W of the combination 460 of the color glass 410 and the attaching layer 420 may be substantially constant. The combined thickness of the combination 460 may be, e.g., about 0.05 mm to 0.55 mm. According to certain embodiments, the combined thickness of the combination 460 may be about 0.5 mm.

According to various embodiments, the attaching layer 420 of the cover glass 400 may be attached onto one surface of the color glass 410 facing in the inward direction (−Z-axis direction). The attaching layer 420 may be formed of a thermoplastic plastic, e.g., a polycarbonate (PC) material. The attaching layer 420 may have a shape corresponding to the color glass 410. The attaching layer 420 may be formed to have a thickness except for the variable thickness of the color glass 410 from the constant combined thickness W of the combination 460 of the color glass 410 and the attaching layer 420. For example, when the thickness of the color glass 410 is 'w1', the thickness of the attaching layer may be 'W−w1'. Accordingly, when the thickness of the color glass 410 varies, the thickness of the attaching layer 420 may also vary. When the thickness of the color glass 410 is constant, the thickness of the attaching layer 420 may also be constant.

According to various embodiments, the printed layer 430 of the cover glass 400 may be disposed on one surface of the attaching layer 420 facing in the inward direction (−Z-axis direction). For example, the printed layer 430 may be printed on one surface of the attaching layer 420. The printed layer 430 may be, e.g., a shielding printed layer. The thickness of the printed layer 430 may be, e.g., about 0.01 mm. The printed layer 430 may be formed in a second color different from the first color forming a gradation. Accordingly, it is possible to provide a more enhanced sense of color to the gradation effect displayed by the color glass 410 and the attaching layer 420. The printed layer 430 may be implemented through various methods, such as silk screen printing or spray painting. However, the color or manufacturing method for the printed layer 430 is not limited to the above embodiment, and various design changes may be made thereto to provide an enhanced sense of color.

According to various embodiments, at least a portion of the color glass 410 may include a curved surface (e.g., 2.5D, or 3D). For example, the color glass 410 may be formed to have a shape corresponding to a second surface (e.g., the second surface 310B of FIG. 3) of the rear plate (e.g., the rear plate 311 of FIG. 3) and two second areas (e.g., the second areas 310E of FIG. 3) seamlessly bending and extending from the second surface (e.g., the second surface 310B of FIG. 3) to the front plate (e.g., the front plate 302 of FIG. 3). For example, the color glass 410 may include a flat portion corresponding to the second surface 310B and curved portions extending from the flat portion to form curved surfaces and corresponding to the second areas 310E. Accordingly, it may have a concave structure and a convex structure on any one surface thereof. In this case, the color glass 410 may have various gradation effects depending on the thickness of each portion of the color glass 410.

Figure 7:
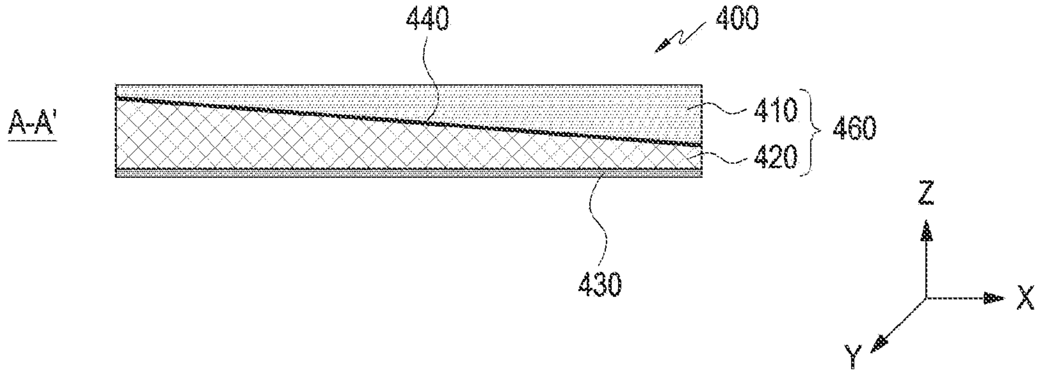
FIG. 7 is a cross-sectional view illustrating a cover glass including a colored attaching layer according to various embodiments of the disclosure.
Figure 8:
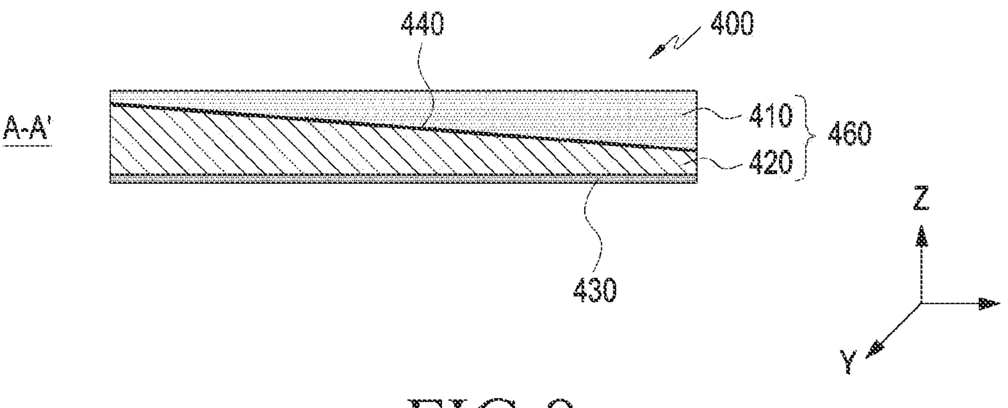
FIG. 8 is a cross-sectional view illustrating a cover glass including a semi-transparent colored attaching layer according to various embodiments of the disclosure.

FIG. 7 is a cross-sectional view illustrating a cover glass 400 including a colored attaching layer 420 according to various embodiments of the disclosure. FIG. 8 is a cross-sectional view illustrating a cover glass 400 including a semi-transparent colored attaching layer 420 according to various embodiments of the disclosure.

Referring to FIGS. 7 and 8, the cover glass 400 may include a color glass 410, an attaching layer 420 disposed under the color glass 410 and formed to correspond to the color glass 410, a printed layer 430 disposed under the attaching layer 420, and an adhesive layer 440. The color glass 410, the attaching layer 420, the printed layer 430, and the adhesive layer 440 of FIGS. 7 and 8 may be wholly or partially identical in configuration to the color glass 410, the attaching layer 420, the printed layer 430, and the adhesive layer 440 of FIGS. 5B and 6.

According to various embodiments, the attaching layer 420 may be formed of a thermoplastic plastic, e.g., a polycarbonate (PC) material. The attaching layer 420 may be colorless and transparent due to the nature of polycarbonate. According to certain embodiments, the transparent polycarbonate forming the attaching layer 420 may be replaced with colored polycarbonate. According to certain embodiments, the transparent polycarbonate forming the attaching layer 420 may be replaced with semi-transparent colored polycarbonate. In this case, the replacement color may be a second color different from the first color forming the gradation. As the second color, various colors may be selected depending on customers' needs. The cover glass 410 formed in the first color and the attaching layer 420 formed in the second color may be stacked one over the other, thereby implementing a gradation effect of the first color and the second color.

Figure 9A:
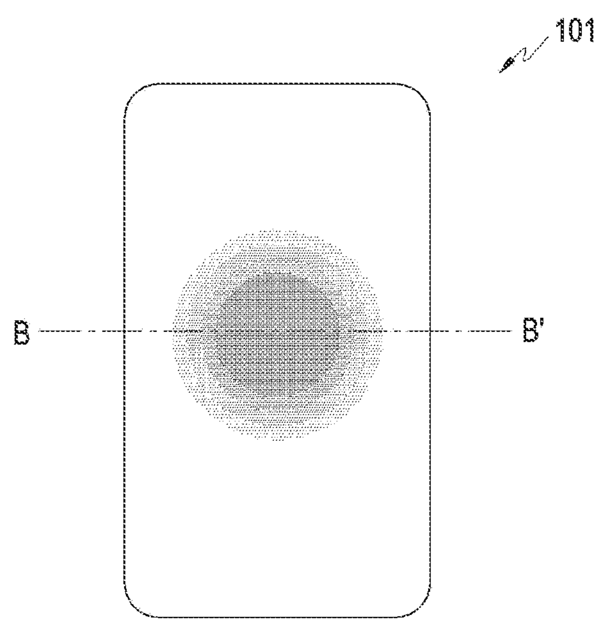
FIG. 9A is a rear view illustrating an electronic device according to various embodiments of the disclosure.
Figure 9B:
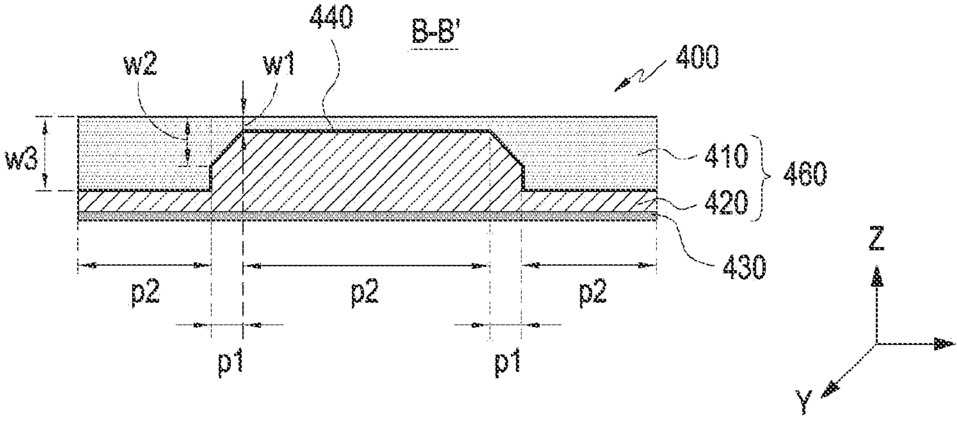
FIG. 9B is a cross-sectional view illustrating a cover glass taken along line B-B' of an electronic device according to various embodiments of the disclosure.

FIG. 9A is a rear view illustrating an electronic device 101 according to various embodiments of the disclosure. FIG. 9B is a cross-sectional view illustrating a cover glass 400 taken along line B-B' of an electronic device 101 according to various embodiments of the disclosure.

Referring to FIG. 9B, the cover glass 400 may include a color glass 410, an attaching layer 420 disposed under the color glass 410 and formed to correspond to the color glass 410, a printed layer 430 disposed under the attaching layer 420, and an adhesive layer 440.

The color glass 410, the attaching layer 420, the printed layer 430, and the adhesive layer 440 of FIG. 9B may be wholly or partially identical in configuration to the color glass 410, the attaching layer 420, the printed layer 430, and the adhesive layer 440 of FIGS. 7 and 8.

The color glass 410 may include a surface parallel to the XY plane. The thickness from one surface to the other may not be uniform. According to various embodiments, the color glass 410 may include two or more thicknesses, and it may have, e.g., a first thickness w1 and a second thickness w2 different from the first thickness w1. In this case, the thickness change of the color glass 410 may be discontinuous. In this case, the color glass 410 may include a first portion p1 having a first thickness w1 and a second thickness w2 different from the first thickness w1. In this case, the first portion p1 may be configured to change sequentially from the first thickness w1 to the second thickness w2. For example, when the thickness of the left end of the first portion p1 is 'w1' and the thickness of the right end of the first portion p1 is 'w2' (w1<w2), the thickness of the first portion p1 may sequentially vary from 'w1' to 'w2.' The two or more thicknesses may be connected in a stepwise manner or obliquely.

According to certain embodiments, referring to FIG. 9B, the thickness of the central portion of the electronic device 101 may be the first thickness w1, and the thickness of an edge of the electronic device may be the second thickness w2 different from the first thickness w1. Further, a third thickness w3 different from the first thickness w1 or the second thickness w2 may discontinuously abut the first thickness w1 or the second thickness w2. In other words, the first portion p1 including the first thickness w1 and the second thickness w2 and the third thickness w3 may discontinuously abut each other. Accordingly, it is possible to implement a gradation effect in various manners depending on the user's demand and to create various patterns using the gradation, thereby enhancing an aesthetic feeling.

Figures 10A, 10B:
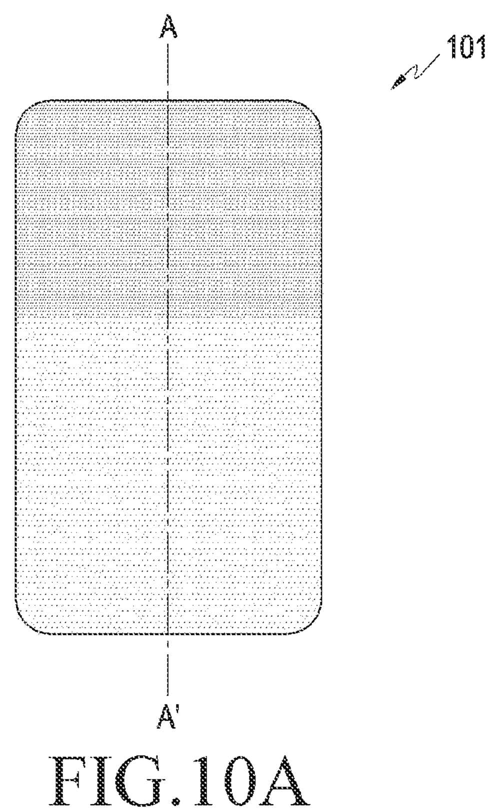
FIG. 10A is a rear view illustrating an electronic device according to various embodiments of the disclosure.
FIG. 10B is a cross-sectional view illustrating a cover glass taken along line A-A' of an electronic device according to various embodiments of the disclosure.
Figure 10C:
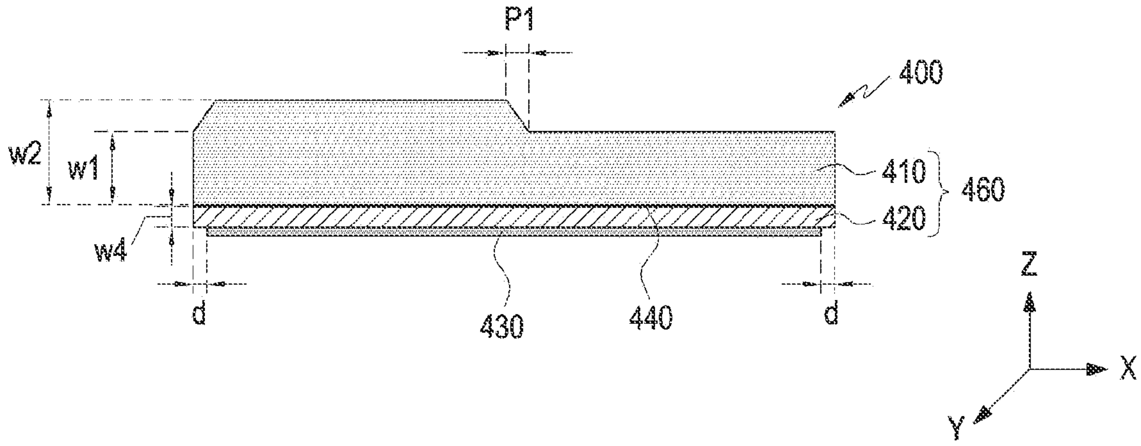
FIG. 10C is a cross-sectional view illustrating a cover glass taken along line A-A' of an electronic device according to various embodiments of the disclosure.

FIG. 10A is a rear view illustrating an electronic device 101 according to various embodiments of the disclosure. FIG. 10B is a cross-sectional view illustrating a cover glass 400 taken along line A-A' of an electronic device 101 according to various embodiments of the disclosure. FIG. 10C is a cross-sectional view illustrating a cover glass 400 taken along line A-A' of an electronic device 101 according to various embodiments of the disclosure.

Referring to FIG. 10B, the cover glass 400 may include a color glass 410, an attaching layer 420 disposed under the color glass 410 and formed to correspond to the color glass 410, a printed layer 430 disposed under the attaching layer 420, and an adhesive layer 440. The color glass 410, the attaching layer 420, the printed layer 430, and the adhesive layer 440 of FIG. 10B may be wholly or partially identical in configuration to the color glass 410, the attaching layer 420, the printed layer 430, and the adhesive layer 440 of FIG. 9B.

The color glass 410 may include a surface parallel to the XY plane. The thickness from one surface to the other may not be uniform. According to certain embodiments, one surface parallel to the XY plane may be in the inward direction (−Z-axis direction) of the electronic device 101, and the other surface having non-uniform thicknesses may be in the outward direction (+Z-axis direction) of the electronic device 101.

According to various embodiments, the color glass 410 may include two or more thicknesses, and it may have, e.g., a first thickness w1 and a second thickness w2 different from the first thickness w1. In this case, the thickness change of the color glass 410 may be discontinuous. In this case, the color glass 410 may include a first portion p1 having a first thickness w1 and a second thickness w2 different from the first thickness w1. In this case, the first portion p1 may be configured to change sequentially from the first thickness w1 to the second thickness w2. For example, when the thickness of the left end of the first portion p1 is 'w1' and the thickness of the right end of the first portion p1 is 'w2' (w1<w2), the thickness of the first portion p1 may sequentially vary from 'w1' to 'w2.' The two or more thicknesses may be connected in a stepwise manner or obliquely.

According to certain embodiments, the attaching layer 420 of the cover glass 400 may be attached onto one surface of the color glass 410 facing in the inward direction (−Z-axis direction). The attaching layer 420 does not correspond to the color glass 410 and may have a constant thickness w4. For example, even when the thickness of the color glass 410 varies, the thickness of the attaching layer 420 may be constant.

According to certain embodiments, the combination 460 of the color glass 410 and the attaching layer 420 may be non-uniform. For example, the combined thickness of the combination 460 may be 'w1+w4' which is a combination of the color glass thickness w1 and the attaching layer w4 or 'w2+w4' which is a combination of the color glass thickness w2 and the attaching layer w4. The combined thickness of the combination 460 may be, e.g., about 0.05 mm to 0.55 mm. According to another embodiment, the combined thickness of the combination 460 may be about 0.5 mm.

According to various embodiments, referring to FIG. 10B, the printed layer 430 of the cover glass 400 may be disposed on one surface of the attaching layer 420 facing in the inward direction (−Z-axis direction). For example, the printed layer 430 may be printed on one surface of the attaching layer 420. The printed layer 430 may be, e.g., a shielding printed layer. According to certain embodiments, the printed layer 430 of the cover glass 400 may be disposed at a portion spaced apart by a designated distance d in a direction from the edge of the attaching layer 420 to the center of the electronic device 101. Accordingly, it may be formed to have a small size as compared with the attaching layer 420.

Figure 11:
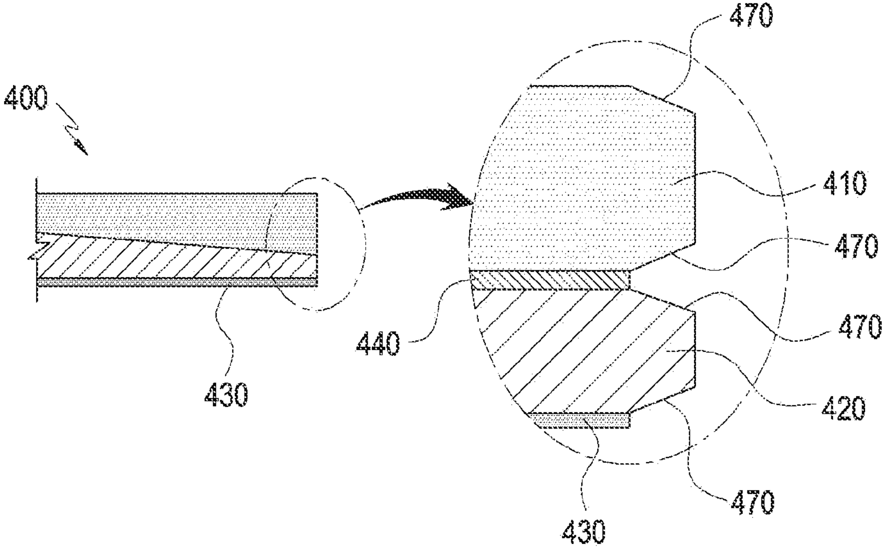
FIG. 11 is a partially enlarged cross-sectional view illustrating a cover glass including chamfering according to various embodiments of the disclosure.

FIG. 11 is a partially enlarged cross-sectional view illustrating a cover glass 400 including chamfering according to various embodiments of the disclosure.

Referring to FIG. 11, a cover glass 400 may include a color glass 410, an attaching layer 420, a printed layer 430, and an adhesive layer 440. The color glass 410, the attaching layer 420, the printed layer 430, and the adhesive layer 440 of FIG. 11 may be wholly or partially identical in configuration to the color glass 410, the attaching layer 420, the printed layer 430, and the adhesive layer 440 of FIG. 10B.

According to various embodiments, chamfering 470 may be performed on each corner of the color glass 410 and the attaching layer 420. In other words, chamfering 470 may be performed on the edge where a first surface of each of the color glass 410 and the attaching layer 420 meets a second surface thereof which vertically abuts the first surface. This may prevent a direct collision between the color glass 410 and the attaching layer 420 in a situation of drop impact, thereby increasing the impact strength of the combination 460 of the color glass 410 and the attaching layer 420.

According to various embodiments, the color glass 410 and the attaching layer 420 may be coupled through the adhesive layer 440. In this case, the attaching layer 420 may be disposed to constantly offset from an end of the color glass 410 or the attaching layer 420 to the inside of the electronic device to prevent the adhesive layer 440 from projecting to the end of the color glass 410 or the attaching layer 420 due to pressure while joined. For example, the adhesive layer 440 may be offset by about 100 μm. In this case, it was identified that the protrusion and overflow issues were mitigated by +70/−100 um process tolerance control. The adhesive layer 440 may be offset from the inside of the chamfering 470. Accordingly, the color glass 410 and the attaching layer 420 may be adhered to each other without stain or protrusion of the adhesive layer 440.

Figure 12:
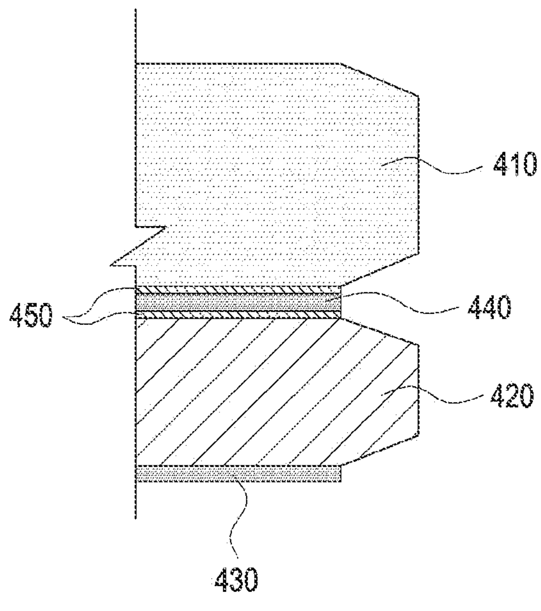
FIG. 12 is a partially enlarged cross-sectional view illustrating a cover glass including a buffering layer according to various embodiments of the disclosure.

FIG. 12 is a partially enlarged cross-sectional view illustrating a cover glass 400 including a buffering layer 450 according to various embodiments of the disclosure.

Referring to FIG. 12, a cover glass 400 may include a color glass 410, an attaching layer 420, a printed layer 430, an adhesive layer 440, and a buffering layer 450. The color glass 410, the attaching layer 420, the printed layer 430, and the adhesive layer 440 of FIG. 12 may be wholly or partially identical in configuration to the color glass 410, the attaching layer 420, the printed layer 430, and the adhesive layer 440 of FIG. 11.

According to certain embodiments, the color glass 410 and the attaching layer 420 may be bonded together, with the adhesive layer 440 and the buffering layer 450 on an upper or lower surface of the adhesive layer 440.

According to various embodiments, the buffering layer 450 may include a variety of foam materials including at least one component of polystyrene, polyethylene, polyethylene terephthalate, and polyurethane (PU) components. A study revealed that polyurethane foam was the most suitable as the buffering layer 450 and that a composite sheet in which polyethylene terephthalate (PET) and polyurethane were combined exhibited better performance in terms of buffering and adhesive strength. This may be why having polyethylene terephthalate on one surface of the polyurethane may facilitate control of, e.g., repulsion, with the buffering layer 450, and polyethylene terephthalate exhibits better adhesion with glass than polyurethane, which is a foam material. By adding the buffering layer 450 to the upper or lower surface of the adhesive layer 440, the cover glass 400 may be protected from external impact, such as a drop.

Figure 13:
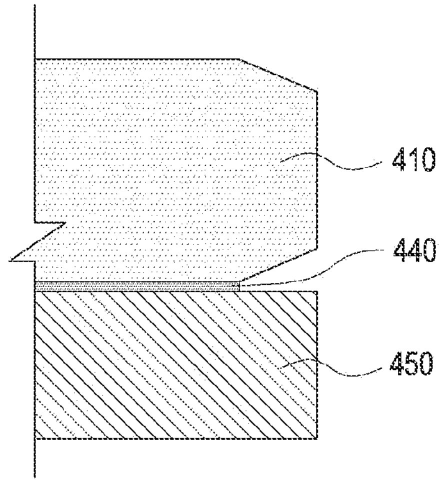
FIG. 13 is a partially enlarged cross-sectional view illustrating a cover glass, in which an attaching layer is replaced with a buffering layer, according to various embodiments of the disclosure.

FIG. 13 is a partially enlarged cross-sectional view illustrating a color glass 400 in which the attaching layer 420 is replaced with a buffering layer 450 according to various embodiments of the disclosure.

Referring to FIG. 13, a cover glass 400 may include a color glass 410, an adhesive layer 440, and a buffering layer 450. The color glass 410, the adhesive layer 440, and the buffering layer 450 of FIG. 13 may be wholly or partially identical in configuration to the color glass 410, the adhesive layer 440, and the buffering layer 450 of FIG. 12.

According to certain embodiments, the buffering layer 450, not the attaching layer 420, may be bonded with the color glass 410. Use of the buffering layer 450 formed of polyurethane, which has good elasticity as compared with the attaching layer 420 formed of hard polycarbonate, may provide advantages in terms of external impact and fall.

According to various embodiments, the color of the buffering layer 450 may include a second color different from the first color forming the gradation.

Figure 14A:
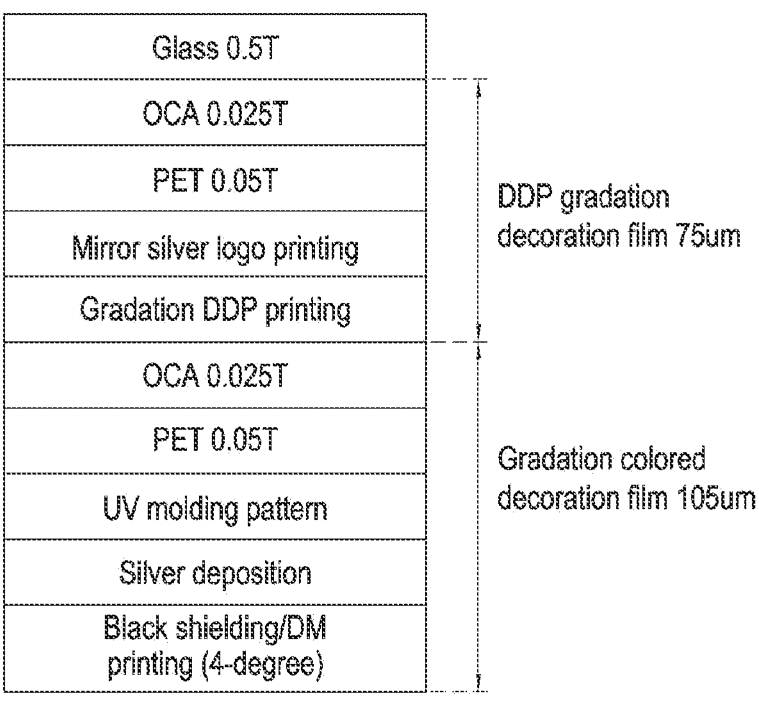
FIG. 14A is a cross-sectional view illustrating a stacked structure of a cover of an electronic device according to various embodiments of the disclosure.
Figure 14B:
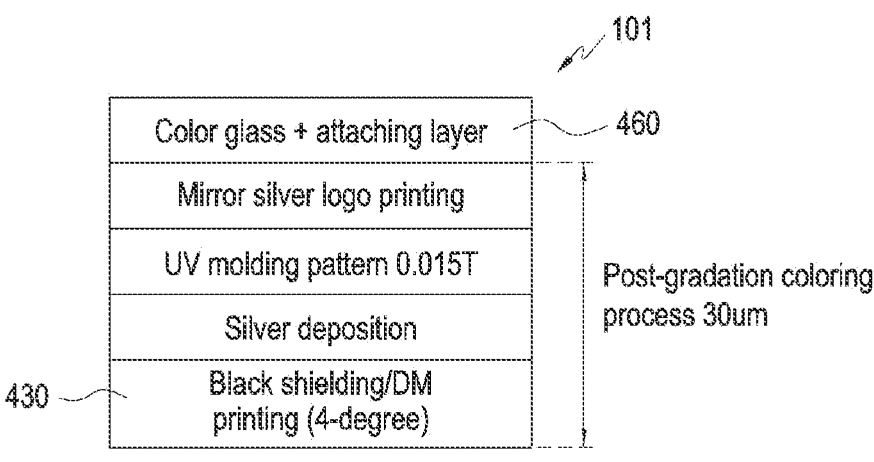
FIG. 14B is a cross-sectional view illustrating a stacked structure of a cover of an electronic device according to various embodiments of the disclosure.

FIG. 14A is a cross-sectional view illustrating a stacked structure of a cover of an electronic device according to a comparative embodiment of the disclosure. FIG. 14B is a cross-sectional view illustrating a stacked structure of a cover of an electronic device according to various embodiments of the disclosure.

According to various embodiments, in an electronic device cover, the overall thickness of the OCA film layer or the PET layer may be reduced as compared with an electronic device cover according to a comparative example manufactured using the DDP thermal transfer method. The electronic device cover according to the comparative example may be overall about 680 um thick by joining a DDP gradation decoration film (e.g., 75 um thick) and a gradation colored decoration film (e.g., 105 um thick) to a cover glass (e.g., 0.5 mm thick). The electronic device cover may be overall 530 um thick as a result of joining to a cover glass (e.g., 0.5 mm thick) after gradation coloring (e.g., 30 um thick). Therefore, the thickness may be reduced by about 150 um.

According to various embodiments of the disclosure, an electronic device 101 (e.g., the electronic device 101 of FIGS. 1 to 4) may comprise a cover glass (e.g., the cover glass 400 of FIG. 5B) covering at least a first surface. The cover glass may include a color glass (e.g., the color glass 410 of FIG. 5B) including an end having a first thickness (e.g., the first thickness w1 of FIG. 5B) and an end having a second thickness (e.g., the second thickness w2 of FIG. 5B) different from the first thickness and configured to sequentially vary in thickness from the first thickness to the second thickness, an attaching layer (e.g., the attaching layer 420 of FIG. 5B) disposed under the color glass and including a shape corresponding to the sequentially varying thickness of the color glass, and a printed layer (e.g., the printed layer 430 of FIG. 5B) disposed under the attaching layer.

According to various embodiments, the color glass may be formed in a first color, and the first color may form a gradation of the cover glass.

According to various embodiments, a combination 460 of the color glass and the attaching layer has a substantially constant combined thickness (e.g., the combined thickness W of the combination of FIG. 5B).

According to various embodiments, the combined thickness of the combination (e.g., the combination 460 of FIG. 5B) may be 0.05 mm to 0.55 mm.

According to various embodiments, the attaching layer may be formed in a second color that is opaque and different from the first color, and the second color may form a gradation of the cover glass.

According to various embodiments, the attaching layer may be semi-transparent.

According to various embodiments, the attaching layer may include polycarbonate (PC).

According to various embodiments, the color glass may include a shape obtained by chamfering (e.g., chamfering 470 of FIG. 11) an edge where a first surface of the color glass meets a second surface vertically abutting the first surface.

According to various embodiments, the attaching layer may include a shape obtained by chamfering an edge where a first surface of the attaching layer meets a second surface vertically abutting the first surface.

According to various embodiments, at least a portion of the color glass may have a curved surface.

According to various embodiments, the electronic device may further comprise an adhesive layer bonding the color glass with the attaching layer.

According to various embodiments, the adhesive layer may include at least one of epoxy, acrylic, and ester component.

According to various embodiments, the adhesive layer may be disposed to be offset from an end of the color glass or the attaching layer to an inside of the electronic device.

According to various embodiments, the electronic device may further comprise a buffering layer disposed on an upper or lower surface of the adhesive layer to protect the cover glass from external impact.

According to various embodiments, the buffering layer may include at least one of polystyrene, polyethylene, polyurethane, and polyethylene terephthalate.

According to various embodiments, the electronic device may further comprise a combination of the color glass and a buffering layer disposed under the color glass.

According to various embodiments, the printed layer may be printed on a surface of the attaching layer to provide a sense of color for gradation of the cover glass.

According to various embodiments, the printed layer may be formed in a second color different from the first color, and the second color may form a gradation of the cover glass.

According to various embodiments of the disclosure, an electronic device may comprise a cover glass covering at least a first surface. The cover glass may include a color glass. The color glass may include a first portion (e.g., the first portion p1 of FIG. 9B) including an end having a first thickness and an end having a second thickness different from the first thickness and a second portion (e.g., the second portion p2 of FIG. 9B) including a constant third thickness (e.g., the third thickness w3 of FIG. 9B). The first portion may be configured to sequentially vary from the first thickness to the second thickness.

According to various embodiments, an end of the first portion may differ in thickness from an end of the second portion, and the first portion and the second portion may be discontinuously coupled to each other.

It is apparent to one of ordinary skill in the art that the electronic device including a cover glass according to various embodiments of the disclosure as described above are not limited to the above-described embodiments and those shown in the drawings, and various changes, modifications, or alterations may be made thereto without departing from the scope of the present invention.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:

a housing;

a front cover glass defining at least a portion of a front exterior surface of the electronic device; and a rear cover glass defining at least a portion of a rear exterior surface of the electronic device;

wherein the rear cover glass includes:

a color glass including a first portion having a first thickness and a second thickness greater than the first thickness, and varying in thickness from the first thickness to the second thickness, the first portion being disposed at least at an area of the color glass distal from an edge portion of the housing, a second portion having the first thickness and disposed between the first portion and an edge portion of the housing, and a third portion having the second thickness and disposed on an opposite side of the first portion from the edge portion of the housing;

wherein the first portion is disposed between the second portion and the third portion and, wherein the second portion and the third portion face substantially the same direction, an attaching layer disposed under the color glass; and a printed layer disposed under the attaching layer.

2. The electronic device of claim 1, wherein the attaching layer is disposed between the color glass and the printed layer, and wherein one surface of the attaching layer is attached to the color glass and another surface of the attaching layer is attached to the printed layer.

3. The electronic device of claim 2, wherein the one surface of the attaching layer is substantially parallel to the another surface of the attaching layer.

4. The electronic device of claim 1, wherein the first portion of the color glass includes a first boundary defined by the first thickness, a second boundary defined by the second thickness and connected to the first boundary, and a connection part connected to the first boundary and the second boundary.

5. The electronic device of claim 4, wherein the connection part is at least partially inclined.

6. The electronic device of claim 1, wherein a thickness of the attaching layer is different from a thickness of the printed layer.

7. The electronic device of claim 6, wherein the thickness of the attaching layer is different from the first thickness and the second thickness of the first portion of the color glass.

8. The electronic device of claim 1, wherein the color glass has a first color, and wherein the attaching layer has a second color different from the first color.

9. The electronic device of claim 1, wherein the color glass has a first color, and wherein the printed layer has a second color different from the first color.

10. The electronic device of claim 1, further comprising a camera at least partially covered by the rear cover glass.

11. The electronic device of claim 1, further comprising a display at least partially covered by the front cover glass.

12. The electronic device of claim 1, wherein the printed layer includes a first surface facing the color glass and a second surface opposite to the first surface, and wherein the second surface is substantially parallel to the first surface.

* * * * *